(12) United States Patent
Lee et al.

(10) Patent No.: US 6,721,161 B2
(45) Date of Patent: Apr. 13, 2004

(54) SOLE STRUCTURE FOR ELECTROSTATIC DISSIPATIVE FOOTWEAR AND METHOD OF MAKING SAME

(75) Inventors: Chien Lee, Taipai (TW); Donald R. Jensen, Bonita Springs, FL (US)

(73) Assignee: Iron Age Corporation, Pittsburgh, PA (US)

(*) Notice: Subject to any disclaimer, the term of this patent is extended or adjusted under 35 U.S.C. 154(b) by 187 days.

(21) Appl. No.: 09/844,798

(22) Filed: Apr. 27, 2001

(65) Prior Publication Data

US 2002/0181183 A1 Dec. 5, 2002

Related U.S. Application Data

(63) Continuation-in-part of application No. 09/814,085, filed on Mar. 21, 2001.

(51) Int. Cl.⁷ .................................................. H05F 3/00
(52) U.S. Cl. ........................................ 361/223; 361/224
(58) Field of Search .................................. 361/224, 223

(56) References Cited

U.S. PATENT DOCUMENTS

| | | |
|---|---|---|
| 2,710,366 A | 6/1955 | Stern et al. |
| 2,712,009 A | 6/1955 | Deans et al. |
| 2,712,099 A | 6/1955 | Legge |
| 2,857,556 A | 10/1958 | Price |
| 2,904,724 A | 9/1959 | Mendoza |
| 2,933,651 A | 4/1960 | Legge |
| 3,015,754 A | 1/1962 | Legge |
| 3,196,314 A | 7/1965 | Meltzer |
| 3,200,292 A | 8/1965 | Meltzer |
| 3,287,602 A | 11/1966 | Meltzer |
| 3,293,494 A | 12/1966 | Fischer |
| 3,544,841 A | 12/1970 | Peel |
| 3,898,538 A | 8/1975 | Dalton |
| 4,150,418 A | 4/1979 | Berbeco |
| 4,366,630 A | 1/1983 | Bloom |
| 4,551,783 A | 11/1985 | Cohen et al. |
| 4,727,452 A | 2/1988 | Brownlee |
| 4,785,371 A | 11/1988 | Edwards |
| 4,926,570 A | 5/1990 | Fohst |
| 5,191,505 A | 3/1993 | Gordon et al. |
| 5,233,769 A | 8/1993 | Webert |
| 5,319,867 A | 6/1994 | Weber |
| 5,426,870 A | 6/1995 | Purnell et al. |
| 5,448,840 A | 9/1995 | Cheskin |
| 5,653,047 A | 8/1997 | Franey |
| 5,786,977 A | 7/1998 | Cohen |
| 6,003,247 A | 12/1999 | Steffe |
| 6,219,942 B1 | 4/2001 | Fini |
| 6,421,222 B1 | 7/2002 | Maritz et al. |

FOREIGN PATENT DOCUMENTS

| | | |
|---|---|---|
| DE | 2250551 | 4/1974 |
| FR | 1422616 | 11/1965 |
| TW | 164483 | 7/1991 |
| WO | WO 99/21449 | 5/1999 |
| WO | WO 00/57405 | 9/2000 |

OTHER PUBLICATIONS

Written Opinion issued in connection with PCT/US01/46103 on Apr. 24, 2003.

Primary Examiner—Gregory J. Toatley, Jr.
Assistant Examiner—Isabel Rodriguez
(74) Attorney, Agent, or Firm—Kirkpatrick & Lockhart LLP (57) ABSTRACT

An electrostatic circuit for a sole having an outsole, an insole and a midsole positioned between the insole and outsole. In one embodiment, the electrostatic circuit includes at least one conductor path that is printed on a first side of a first substrate. The conductor path may have a first exposed end attachable to the outsole and a second exposed end attachable to the insole. The electrostatic circuit may also include at least one resistor electrically that is coupled to each conductor path and mounted to the first substrate. In another embodiment, the electrostatic circuit may include first and second conductive pads attached to the first and second ends of each conductor path.

64 Claims, 9 Drawing Sheets

SOLE STRUCTURE FOR ELECTROSTATIC DISSIPATIVE FOOTWEAR AND METHOD OF MAKING SAME

CROSS-REFERENCE TO RELATED APPLICATIONS

This application is a continuation-in-part application of U.S. patent application Ser. No. 09/814,085, filed Mar. 21, 2001, entitled Sole Structure For Electrostatic Dissipative Footwear and Method of Making Same.

FEDERALLY SPONSORED RESEARCH

Not applicable.

BACKGROUND OF THE INVENTION

1. Field of the Invention

The invention relates to footwear and, more particularly, to footwear constructed to dissipate electrostatic charges.

2. Description of the Invention Background

Static electricity is the accumulation of electric charge in an insulated body, most frequently caused by friction, but also by other means, such as induction etc. Electrostatic discharge (ESD) is the transfer of electric charge between two bodies, often accompanied by a visible spark, as in the familiar phenomenon of doorknob shock. While electrostatic discharge per se may not be immediately harmful to a human body, at least at level of voltage less than about 3000 volts, a discharge of much smaller voltage might be damaging to sensitive equipment, such as electronic components for computers and magnetic data carriers. A low volt electrostatic discharge may also ignite explosive gases. Accordingly, protection against ESD is required in the electronics and telecommunications industries and in other industries wherein sensitive electrical components or explosive materials are being handled.

ESD is of particular concern to the electronics industries. For example, if a quality control inspector carries a static charge during an inspection or testing operation, at a minimum, the accuracy of the test may be affected or, in worse cases, one or more sensitive components may be damaged. One method commonly employed to address this problem is the use of conductive footwear. By wearing a pair of conductive shoes, the person testing the electronic products is electrically grounded and the static charge is therefore eliminated. Various tests have shown that conductivity, more specifically, the impedance of a conductive shoe must be maintained within a certain range. One company in the computer and electronics industry recommends that the impedance of a conductive shoe be maintained within $10^6$ ohms to $10^7$ ohms. Other forms of grounding have been used to dissipate the electrostatic charge before it builds up to harmful levels. Such grounding measures include installing conductive or dissipative floors or stepping mats and/or wearing conductive wrist straps.

The efficacy of antistatic devices such as footwear, wrist and heel straps, etc. is typically determined by the electrical resistance of the conducting surface of the device in ohms. This electrical resistance may be affected by various environmental factors, such as humidity, dirt and other contamination, wear and other damage. A variable or unreliable electrical resistance does not provide continuous and reliable protection, as required in many environments with components sensitive to relatively small electrostatic discharges.

There remains, therefore, a need for footwear with improved electrostatic discharge properties that overcomes the limitations, shortcomings and disadvantages of the previous approaches.

SUMMARY OF THE INVENTION

The invention meets the identified needs, as well as other needs, as will be more fully understood following a review of this specification and drawings.

One embodiment of the invention comprises an electrostatic circuit for a sole having a conductive outsole, a conductive insole and a nonconductive midsole positioned between the insole and outsole. This embodiment of the electrostatic circuit includes a first substrate that has a first end and a second end. In one embodiment, the substrate is flexible and in another embodiment, the substrate may be relatively rigid and inflexible. The electrostatic circuit may further include at least one conductor path that is attached to the first substrate. Each conductor path has a first exposed end that is adjacent to the first end of the first substrate and that is attachable to the conductive outsole. Each conductor path also has a second exposed end that is adjacent to the second end of the substrate and that is attachable to the conductive insole. In addition, the circuit includes at least one resistor that is electrically coupled to each conductor path and mounted to the first substrate. In alternative embodiments, each end of the conductive paths may be attached to a corresponding conductive pad to provide an enlarged area for affixing the conductive path to the other components of the sole.

Another embodiment of the present invention includes an electrostatic circuit for a sole that has a conductive outsole, a conductive insole and a nonconductive midsole between the insole and outsole. In this embodiment, the electrostatic circuit includes a first substrate that has a first end and a second end. A first conductor path is attached to the first substrate. The first conductor path has a first exposed end that is adjacent to the first end of the first substrate and that is attachable to the conductive outsole. The first conductor path also has a second exposed end that is adjacent to the second end of the first substrate and that is attachable to the conductive insole. A first resistor is supported on the first substrate and is electrically coupled to the first conductor path. In addition, a second conductor path is attached to the first substrate. The second conductor path has a second exposed end that is adjacent to the first end of the first substrate and that is attachable to the conductive outsole. The second conductor path also has a second exposed end that is adjacent to the second end of the first substrate and that is attachable to the conductive insole. A second resistor is supported on the first substrate and is electrically coupled to the second conductor path. A third conductor path is attached to the first substrate. The third conductor path has a first exposed end that is adjacent to the first end of the first substrate and is attachable to the conductive outsole. The third conductive path also has a second exposed end that is adjacent to the second end of the substrate and that is attachable to the conductive insole. A third resistor is supported on the first substrate and is electrically coupled to the third conductor path.

Another embodiment of the present invention comprises a sole for a conductive shoe. The sole includes a conductive outsole and a midsole that is adjacent to the outsole. A conductive insole is adjacent to the midsole. The sole further includes a printed circuit that comprises a first substrate and at least one conductor path that is attached to the first substrate. Each conductor path has a first end that is attached to the conductive outsole and a second end that is attached to the conductive insole. At least one resistor is electrically coupled to each conductor path and mounted to the first substrate.

Yet another embodiment of the present invention comprises a method for applying a desired amount of electrical impendence to an electrostatic current passing through a shoe having a conductive outsole, a conductive insole and a nonconductive midsole between the outsole and insole. The method includes affixing one end of a first conductive path formed on a substrate to the conductive outsole and electrically coupling a first resistor having the desired amount of impedance to the conductive path. The method further includes affixing another end of the first conductive path to the conductive insole.

Another embodiment of the present invention comprises a method of manufacturing a sole for a conductive shoe. The method includes affixing a first conductive path to a substrate such that the first conductive path has a first exposed end and a second exposed end and attaching a first resistor to the first conductive path. The method also includes forming a conductive outsole and a nonelectrically conductive midsole and supporting the nonelectrically conductive midsole on the electrically conductive outsole. The method further includes forming an electrically conductive insole and supporting the electrically conductive insole to the nonelectrically conductive midsole. The substrate is supported within the midsole such that the first exposed end of the first conductive path is in electrical contact with the electrically conductive outsole and the second end of the first electrically conductive path is in electrical contact with the electrically conductive insole.

Other features and advantages of the invention will become apparent from the detailed description of the embodiments set forth herein and from the appended claims.

BRIEF DESCRIPTION OF THE DRAWINGS

In the accompanying Figures, there are shown present embodiments of the invention wherein like reference numerals are employed to designate like parts and wherein.

DETAILED DESCRIPTION OF THE INVENTION

Figure 1:
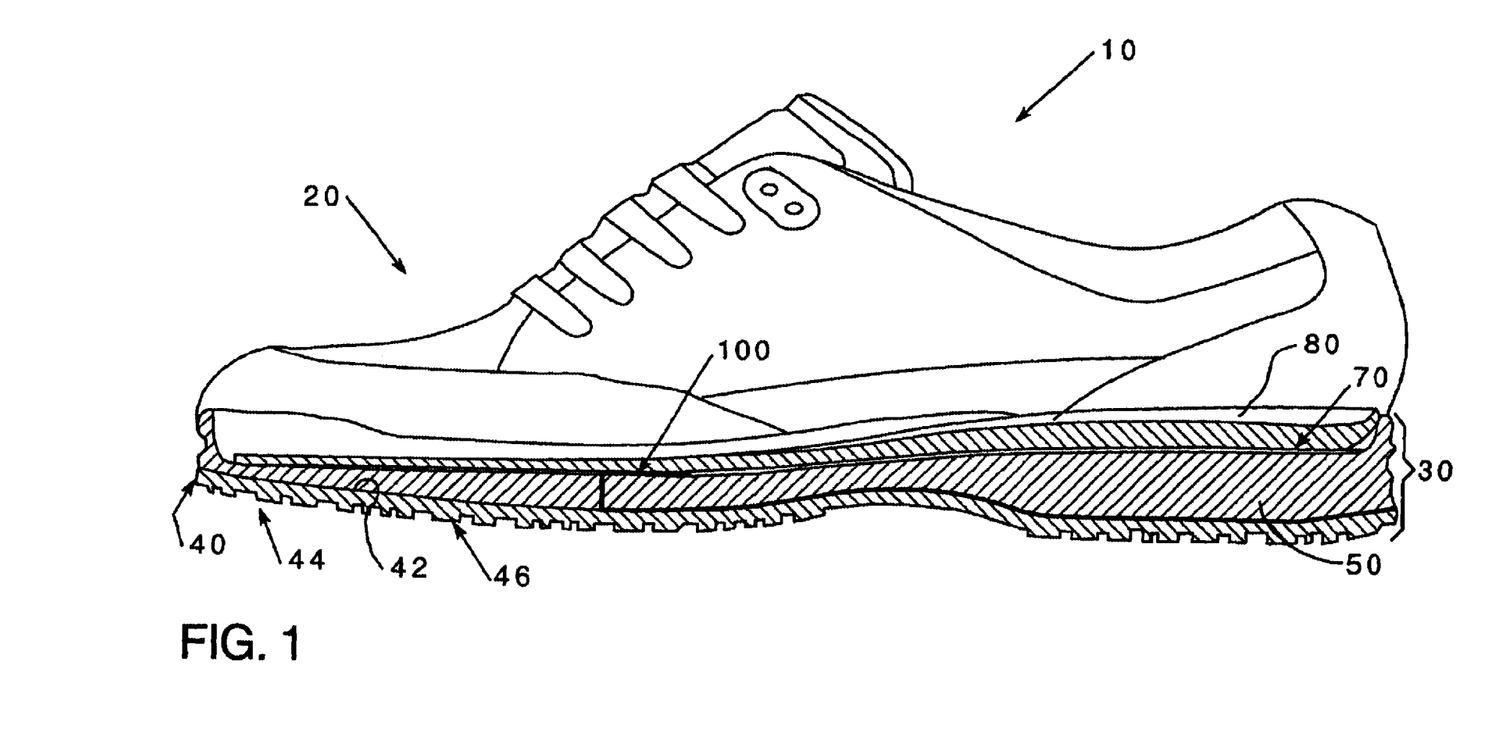
FIG. 1 is a side elevational view of an item of footwear with an embodiment of a sole of the present invention with portions of the sole shown in cross-section.

Referring now to the drawings for the purpose of illustrating the invention and not for the purpose of limiting the same, FIG. 1 illustrates an embodiment of the present invention in the form of an item of footwear 10 employing an embodiment of a flexible printed circuit 100 of the present invention. As the present Detailed Description of the Invention proceeds, those of ordinary skill in the art will appreciate that the flexible printed circuits 100 may be used in combination with a variety of different types of footwear without departing from the spirit and scope of the present invention. Thus, the protection afforded to the various embodiments of the present invention should not be limited to footwear having the specific cross-sectional shape and configuration depicted in FIG. 1.

As can be seen in FIG. 1, the item of footwear 10 includes an upper 20 that may be fabricated from a variety of materials such as canvas, leather, etc. The upper 20 may be attached to the sole assembly 30 by conventional footwear assembly processes and techniques. In this embodiment, the sole assembly 30 includes an electrically conductive outsole 40, a non-electrically conductive midsole 50, an electrically conductive insole 70 and an electrically conductive sock liner 80. In addition, as will be described in further detail below, a flexible circuit 100 is supported within the midsole 50 to define at least one electrically conductive path having a desired impedance that extends between the electrically conductive insole board 70 and the electrically conductive outsole 40. As used herein, the term "electrically conductive" refers to the ability to transmit an electrical current therethrough.

Figure 3:
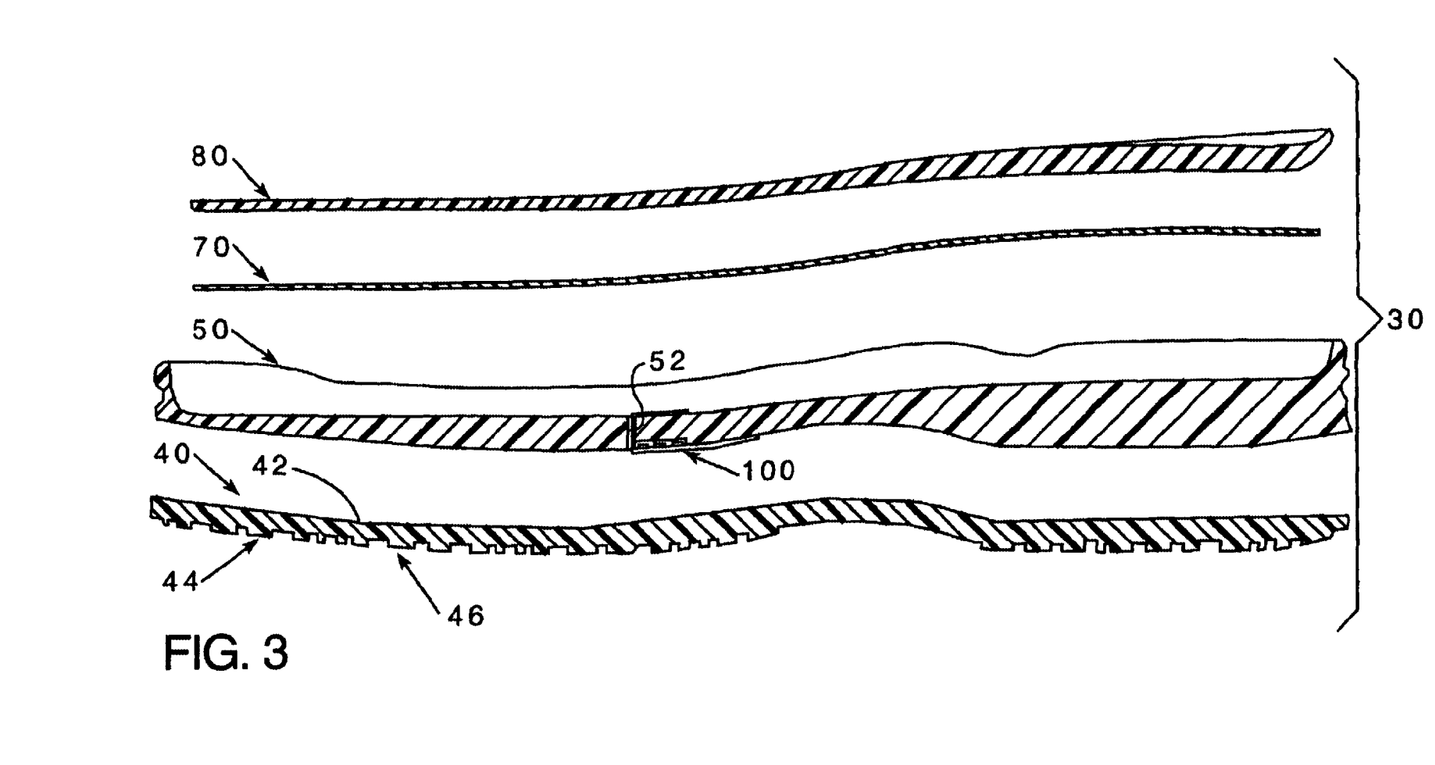
FIG. 3 is a cross-sectional assembly view of the sole of FIG. 1.

In this embodiment, the outsole 40 may be fabricated from a polyurethane or similar rubber material that is mixed with carbon powder utilizing known fabrication techniques and processes such that the outsole 40 will conduct an electrical current. In one embodiment, it is desirable for the outsole 40 to have a resistance value of less than $1 \times 10^6$ ohms. However, the outsole 40 could conceivably be fabricated from other materials having similar electrically conductive characteristics. As can be seen in FIGS. 1 and 3, the outsole 40 has an upper surface 42 and a lower surface 44 that may have a tread pattern 46 formed thereon.

Figure 4:
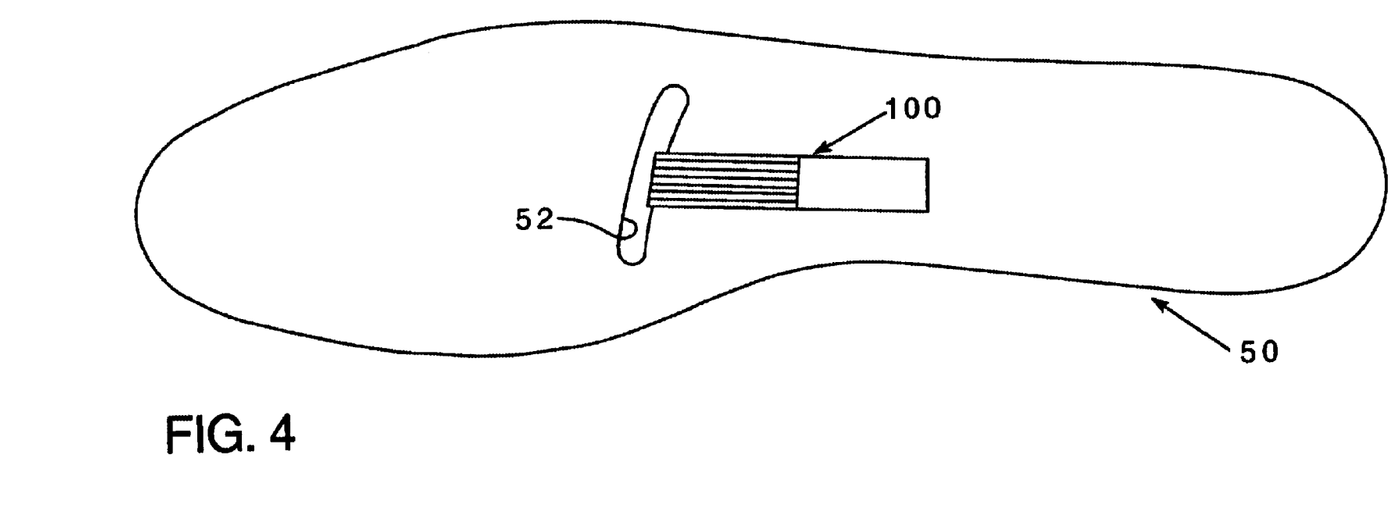
FIG. 4 is a top view of a midsole and a portion of a printed circuit of the present invention.

The midsole 50 of this embodiment may be fabricated from a non-conductive material such as polyurethane or EVA. As used herein, the term "non-conductive" means having an electrical impedance value that is greater than $1 \times 10^7$ ohms. However, the midsole 50 may be fabricated from other suitable materials that essentially do not conduct electrical current. In one embodiment, the midsole 50 has a resistance that is greater than $1 \times 10^7$ ohms. As can be seen in FIGS. 3 and 4, a cavity 52 is provided through the midsole 50 to enable the printed circuit 100 to extend therethrough and thereby be supported by the midsole 50 as will be discussed in further detail below. Also in this embodiment, the insole 70 and the conductive sock liner 80 may be fabricated from polyurethane or similar material that contains a carbon powder to provide these elements with the ability to conduct an electrical current. Also in this embodiment, the insole 70 and the sock liner 80 have a resistance value that is less than $1 \times 10^6$ ohms. Thus, in this embodiment, the outsole 40 has an electrical impedance, the midsole 50 has an electrical impedance that is greater than the electrical impedance of the outsole 40, and the insole 70 has an electrical impedance that is less than the electrical impedance of the midsole.

Figure 5:
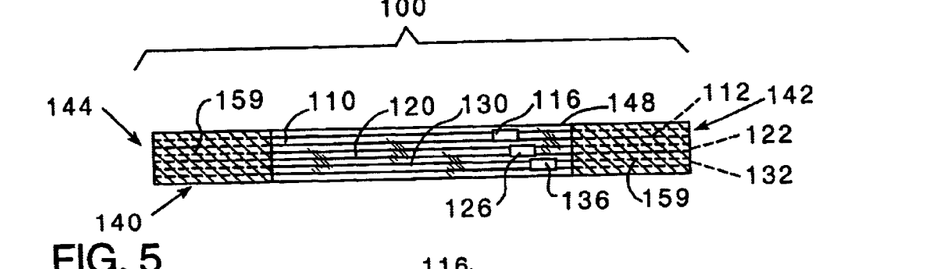
FIG. 5 is a top view of an embodiment of a printed circuit of the present invention.
Figure 6:
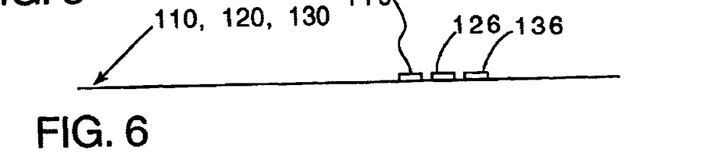
FIG. 6 is a side elevational view of conductive paths of the printed circuit of FIG. 5.

One embodiment of a printed circuit 100 of the present invention is depicted in FIGS. 5–9. In this embodiment, the printed circuit 100 includes at least one electrically conductive path or conductor path. As can be seen in FIGS. 5 and 6, this embodiment of the printed circuit 100 includes a first electrically conductive path 110, a second electrically conductive path 120 and a third electrically conductive path 130. The paths 110, 120, 130 may be formed from copper foil or similar material utilizing conventional chemical milling techniques. In this embodiment, the electrical conductive paths 110, 120, 130 may be approximately 25 μm thick. However, copper foil or similar materials having other thicknesses could conceivably be used.

The electrically conductive paths 110, 120, 130 may be attached to a first substrate 140 with a commercially available adhesive 149 such as that adhesive supplied by King Her Chemical Industrial Corporation of No. 38, 18$^{th}$ RD., Industrial Park, Taichung, Taiwan, R.O.C. However, other similar adhesives may be employed. In this embodiment, the first substrate may comprise a polyimide sheet material and having a thickness of 18 μm. However, other flexible sheet materials may also be used. The first substrate has a first end 142 and a second end 144 and a first side 146 and a second side 148. The first electrically conductive path 110, the second electrically conductive path 120 and the third electrically conductive path 130 are attached to the first side 146 of the first substrate 140 such that a first end 112 of the first path 110 is adjacent the first end 142 of the first substrate and the second end 114 of the first path 110 is adjacent the second end of the first substrate, the first end 122 of the second path is adjacent the first end 142 of the first substrate 140, the second end 124 of the second path 120 is adjacent the second end 144 of the first substrate 140, the first end 132 of the third path 130 is adjacent to the first end 142 of the first substrate 140 and the second end 134 of the third path 130 is adjacent to the second end 144 of the first substrate 140. See FIGS. 5 and 7. The paths 110, 120, 130 may be attached to the first side of 146 of the first substrate 140 by a layer of commercially available adhesive 149, such as that adhesive described above.

Figure 7:
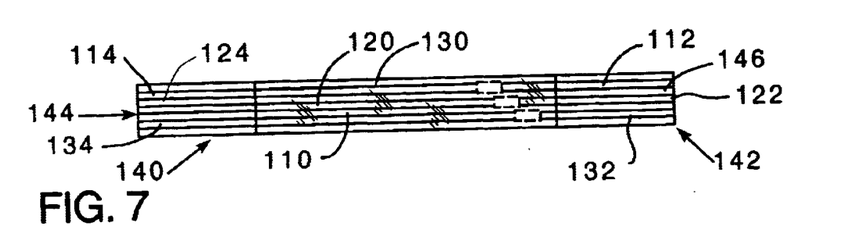
FIG. 7 is a bottom view of the printed circuit of FIG. 5.
Figure 8:
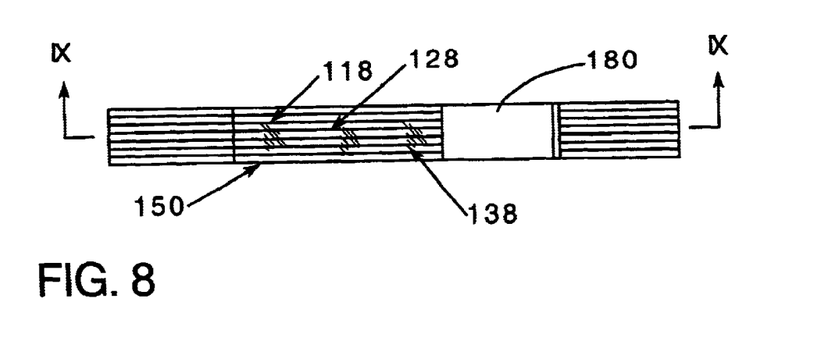
FIG. 8 is another top view of the printed circuit of FIG. 5, with a moisture barrier applied thereto.
Figure 9:
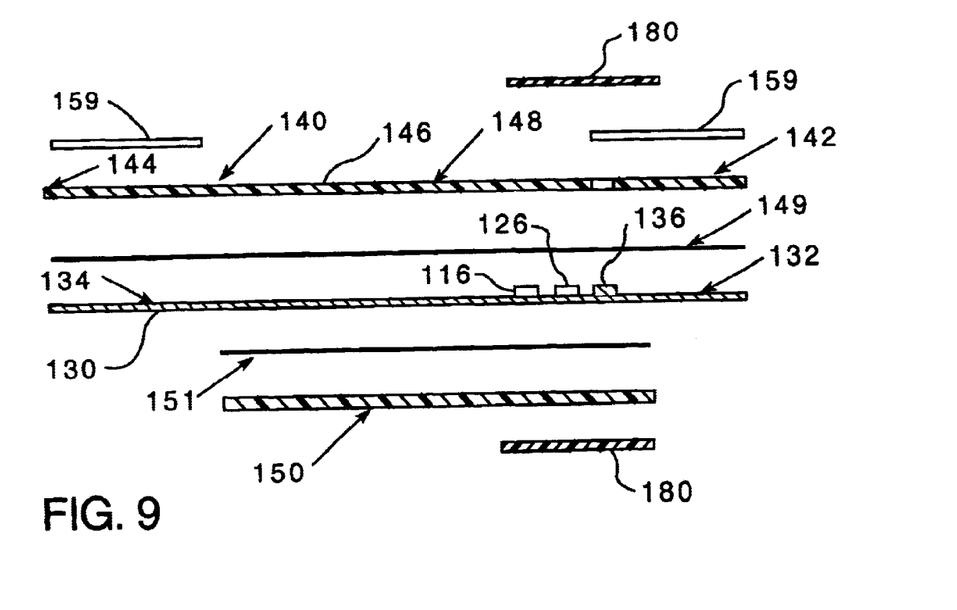
FIG. 9 is a cross-sectional exploded assembly view of the printed circuit of FIG. 8 taken along line IX—IX in FIG. 8.

Also in this embodiment, a first resistor 116 is electrically coupled to the first path 110. A second resistor 126 is electrically coupled to the second path 120. A third resistor 136 is electrically coupled to the third path 130. The resistors 116, 126, 136 may comprise commercially available 6.8M-ohm resistors that extend through the first substrate 140 and are electrically coupled (soldered, etc.) to their respective path. In this embodiment, second substrate 150, in the form of polyimide sheet may be attached to the first side 146 of the first substrate and the central portions 118, 128, 138 of the first, second and third paths 110, 120, 130, respectively by a second layer of commercially available adhesive 151 of the type described above. In particular, the central portion 118 of the first path, the central portion 128 of the second path 120 and the central portion 138 of the third path are encapsulated between the first substrate 140 and the second substrate 150. As can be seen in FIGS. 5 and 7, the second substrate only covers the central portions of the paths such that the first ends 112, 122, 132, of the first, second and third paths 110, 120, 130, respectively are exposed. See FIG. 7. In this embodiment, the printed circuit 100 is assembled under pressure and may have an overall thickness of approximately 80–90 μm. An overall thickness of less than 3 mm should also work well. However, the printed circuit 100 may have a variety of other thicknesses that afford the printed circuit 100 the flexibility to be positioned within the sole assembly 30 as will be further discussed below. Thus, as used herein, the term "flexible" means that at least one portion of the circuit 100 may be bent or positioned relative to another position of the printed circuit such that those portions are not coplanar with respect to each other without damaging the printed circuit or its components (i.e., without hampering or destroying the ability of the first, second and third paths 110, 120, 130, respectively to conduct electrical current). The skilled artisan will appreciate that such construction enables the flexible printed circuit to be installed in a variety of advantageous configurations. It is conceivable, however, that the conductive paths 110, 120, 130, etc. may be affixed to a relatively rigid substrate that that has been preformed to a desired shape for installation in the manner described herein. Therefore, while the flexible substrates and circuits described herein are capable of flexing with the sole, it is conceivable that rigid substrates could also be employed. Thus, the protection afforded to the printed circuit herein should not be limited to circuits formed on flexible substrates, but should also encompass rigid printed circuits.

As was described above, the flexible printed circuit 100 is provided with three paths or conductors 110, 120, 130 that have a corresponding resistor 116, 126, 136 attached thereto. The total amount of resistance through the flexible printed circuit 100 is determined by the quantity and size of resistors employed. For example, the total impedance for the three 6.8M ohm resistors may be calculated as follows:

$$\frac{R1 \times R2 \times R3}{R1 \times R2 + R1 \times R3 + R2 \times R3} = 2.267 \text{ M ohms} = 2.267 \times 10^6 \text{ ohms.}$$

If one of the three resistors fails, the total impedance value for the flexible circuit board of this embodiment will be:

$$\frac{R1 \times R2}{R1 + R2} = 3.4 \text{ M ohms} = 3.4 \times 10^6 \text{ ohms.}$$

As indicated above, at least one major company in the computer industry recommends that the impedance of a conductive shoe be maintained within $10^6$ ohms to $10^7$ ohms. Thus, in this embodiment, even if two resistors fail, the total impedance value will be at $6.8 \times 10^6$ ohms, which is still below the upper limit of $10^7$ ohms.

Those of ordinary skill in the art will appreciate that the impedance of the flexible circuit board may be varied by altering the number of paths (conductors) and resistors to achieve a desired amount of impedance in accordance with standard electrical engineering formulas (i.e., "Ohm's Law"). For example, series arrays or combination arrays may be used and their total impedance may be calculated as follows:

One resistor:
R (total resistance value)=R1
Two resistors (Combination Arrays):

$$R\text{(total resistance value)} = \frac{R1 \times R2}{R1 + R2}$$

Three resistors (Combination Arrays):

$$R\text{(total resistance value)} = \frac{R1 \times R2 \times R3}{R1 \times R2 + R1 \times R3 + R2 \times R3}$$

Series Arrays:
R (total resistance value)=R1+R2+R3+ . . .

In this embodiment, a moisture resistant barrier 180 may be wrapped over the resistors 116, 126, 136 to retard and prevent the infiltration of moisture into the points where the resistors 116, 126, 136 are coupled to the paths 110, 120, 130, respectively. The moisture barrier 180 may comprise a wrapping of conventional electrical insulation tape. However, the moisture resistant barrier 180 may be formed with other materials such as sealant, glue or the like.

Figure 2:
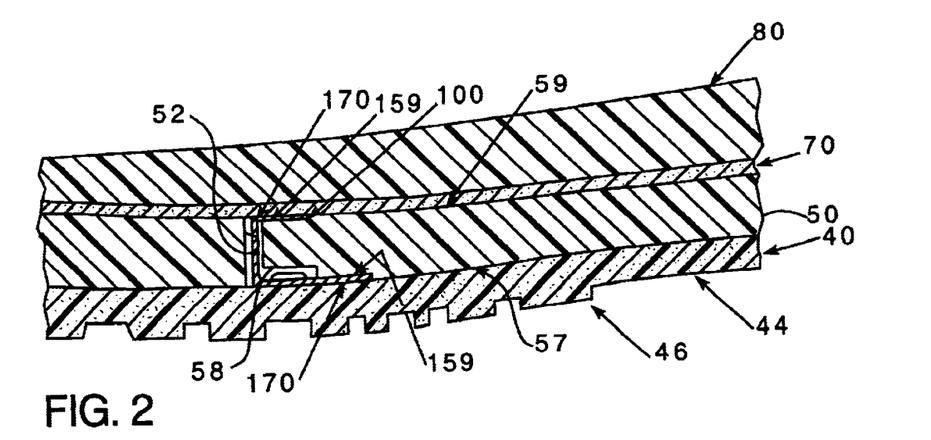
FIG. 2 is an enlarged partial view of the sole of FIG. 1 showing an orientation of one embodiment of a printed circuit of the present invention.

The flexible printed circuit 100 may be installed in the footwear as shown in FIGS. 1, 2, 3 and 4. As can be seen in FIGS. 2 and 4, the midsole 50 has a hole or passageway 52 therethrough sized to receive a portion of the flexible circuit 100. In addition, an undercut 58 area may be provided in the bottom surface 57 of the midsole 50 to accommodate the resistors 116, 126, 136 when the circuit 100 is supported in the midsole 50 as shown. See FIG. 2. As can be seen, such arrangement permits the circuit 100 to be oriented such that the first end 112 of the first path 110, the second end 122 of the second path 120 and the third end 132 of the third path 130 to be in electrical contact with the conductive outsole 40 to transmit electrical current thereto. Similarly, the second end 114 of the first path 110 and the second end 124 of the second path 120 and the second end 134 of the third path 130 are supported in electrical contact with the conductive insole board 70 to receive electrical current therefrom. If desired, the first end 142 of the circuit 100 may be attached to the underside 57 of the midsole with double-sided adhesive tape 159 or other commercially available conductive adhesive. A variety of different types of adhesives or adhesive tapes may be used. For example, the double-sided tape manufactured by the 3M Company under Model No. 467 may be employed. Similarly, the second end 144 of the circuit 100 may be affixed to the upper surface 59 of the midsole by another section of such double-sided adhesive tape 159 or other commercially available adhesive. The reader will appreciate that when the flexible circuit 100 is installed as shown in FIGS. 1, 2, 3, and 4, the exposed ends 112, 122, 132, of the paths 110, 120, 130, respectively remain exposed to contact the conductive outsole 40 and the exposed ends 114, 124, 134 of the paths 110, 120, 130, respectively are exposed to contact the conductive insole board 70. In this embodiment, the end 142 of the flexible circuit 100 that contains the exposed ends 112, 122, 132 may be fastened to the outsole 40 with commercially available ESD conductor glue 170 that has a resistance range of $5 \times 10^4 \sim 10^6$ Ohms. The midsole 50 is attached to the outsole 40 by commercially available conductive cement. Similarly, the insole board 70 is attached to the midsole 50 by commercially available conductive cement. In this embodiment, the sock liner is not attached to the insole board. Thus, when installed as shown in FIGS. 1 and 2, the exposed ends 114, 124, 134 of the paths 110, 120, 130, respectively contact the conductive insole board 70 and the flexible circuit 100 extends through the opening 52 in the midsole 50 and the exposed ends 112, 122, 124 of the paths 110, 120, 130, respectively, contact the conductive outsole 40. Therefore, such arrangement permits a static charge to pass from the foot through the conductive sock liner 80, through the conductive insole board 70, through the paths 110, 120, 130 and resistors 116, 126, 136 to provide an impedance of $2.267 \times 10^6$ ohms. This charge then passes from the paths 110, 120, 130 to the conductive outsole 40 such that the charge is safely dissipated to the floor surface. In this embodiment, by way of example only, the impedance of the respective parts of the sole assembly is: sock liner 80: $2.5 \times 10^4 - 2 \times 10^5$ ohms; insole board 70: $10^4 - 10^5$ ohms; resistors 116, 126, 136: $6.8 \times 10^6$ ohms (each); midsole 50: $10^{11} - 10^{12}$ ohms; conductive outsole 40: $10^4 - 3 \times 10^4$ ohms; and conductive adhesive: $10^4 - 10^5$ ohms.

To test the effectiveness of the above-mentioned design, two different items of footwear manufactured in accordance with the above-mentioned embodiment of the present invention were tested as outlined below by Fowler Associates, Inc. of 3551 Moore-Duncan Highway, Moore, S.C. 29639: Iron Age® Women's Style 492M, SIZE 7M Steel Toe Hiker Test Methods: ANSI Z41-1999**, ESD S 9.1 and ESD DSTM 54.2

Test Equipment: Dr. Thiedig MegOhm Meter Applied voltage: 10 vdc, 100 vdc, 500 vdc Electrodes: 2½ in. aluminum cylinder, aluminum plate, aluminum foil Laboratory conditions: 73° F., 12% RH

| Test Sample | Resistance of Individual to Ground-Ohms Laboratory conditions: 73° F., 12% | | | |
|---|---|---|---|---|
| | After 3 mins. of Wear | | After 5 mins. of Wear | |
| | 10 v | 100 v | 10 v | 100 v |
| Style 492M | | | | |
| Both | $2.69 \times 10^6$ | $1.83 \times 10^6$ | $2.50 \times 10^6$ | $1.73 \times 10^6$ |
| Left | $4.23 \times 10^6$ | $3.18 \times 10^6$ | $4.15 \times 10^6$ | $3.13 \times 10^6$ |
| Right | $4.43 \times 10^6$ | $3.41 \times 10^6$ | $4.23 \times 10^6$ | $3.35 \times 10^6$ |

| Test Sample | Resistance of Shoe to Ground per ESD S9.1-Ohms 25 lbs. lead shot in Shoe 100 v |
|---|---|
| Style 492M | |
| Left | $4.17 \times 10^6$ |
| Right | $4.81 \times 10^6$ |

** These tests are in general agreement with ANSI Z41-1999 and according to ESD S9.1 and DSTM 54.2. ANSI-Z41 states 50% RH and voltage between 25 volts and 50 volts. These tests were performed at 10 volts and 100 volts at 12% RH. These conditions are more stringent than ANSI Z41.

Iron Age® Women's Style 492M, SIZE 6M Steel Toe Hiker

Test Methods: ANSI Z41-1999**, ESD S 9.1 and ESD DSTM 54.2

Test Equipment: Dr. Thiedig MegOhm Meter Applied voltage: 10 vdc, 100 vdc, 500 vdc Electrodes: 2½ in. aluminum cylinder, aluminum plate, aluminum foil Laboratory conditions: 73° F., 12% RH

| Test Sample | Resistance of Individual to Ground-Ohms Laboratory conditions: 73° F., 12% | | | |
|---|---|---|---|---|
| | After 3 mins. Of Wear | | After 5 mins. of Wear | |
| | 10 v | 100 v | 10 v | 100 v |
| Style 492M | | | | |
| Both | $2.32 \times 10^6$ | $1.44 \times 10^6$ | $2.21 \times 10^6$ | $1.47 \times 10^6$ |
| Left | $3.86 \times 10^6$ | $2.80 \times 10^6$ | $3.87 \times 10^6$ | $2.88 \times 10^6$ |
| Right | $3.49 \times 10^6$ | $2.56 \times 10^6$ | $3.40 \times 10^6$ | $2.55 \times 10^6$ |

| Test Sample | Resistance of Shoe to Ground per ESD S9.1-Ohms 25 lbs. lead shot in Shoe 100 v |
|---|---|
| Style 492M | |
| Left | $4.12 \times 10^6$ |
| Right | $3.01 \times 10^6$ |

** These tests are in general agreement with ANSI Z41-1999 and according to ESD S9.1 and DSTM 54.2. ANSI-Z41 states 50% RH and voltage between 25 volts and 50 volts. These tests were performed at 10 volts and 100 volts at 12% RH. These conditions are more stringent than ANSI Z41.

Iron Age® Women's Style 492M, SIZE 6M Steel Toe Hiker
Test Methods: ANSI Z41-1999**, ESD S 9.1 and ESD DSTM 54.2
  Test Equipment: Dr. Thiedig MegOhm Meter Applied voltage: 10 vdc, 100 vdc, 500 vdc
  Electrodes: 2½ in. aluminum cylinder, aluminum plate, aluminum foil
  Laboratory conditions: 73° F., 12% RH

| | Resistance of Individual to Ground-Ohms Laboratory conditions: 73° F., 50% | | | |
|---|---|---|---|---|
| | After 3 mins. Of Wear | | After 5 mins. of Wear | |
| Test Sample | 10 v | 100 v | 10 v | 100 v |
| Style 492M | | | | |
| Both | $3.48 \times 10^6$ | $1.50 \times 10^6$ | $3.25 \times 10^6$ | $1.60 \times 10^6$ |
| Left | $5.16 \times 10^6$ | $2.84 \times 10^6$ | $4.22 \times 10^6$ | $3.05 \times 10^6$ |
| Right | $5.26 \times 10^6$ | $2.90 \times 10^6$ | $4.05 \times 10^6$ | $2.96 \times 10^6$ |

| | Resistance of Shoe to Ground per ESD S9.1-Ohms 25 lbs. lead shot in Shoe |
|---|---|
| Test Sample | 100 v |
| Style 492M | |
| Left | $3.21 \times 10^6$ |
| Right | $2.78 \times 10^6$ |

** These tests are in general agreement with ANSI Z41-1999 and according to ESD S9.1 and DSTM 54.2. ANSI-Z41 states 50% RH and voltage between 25 volts and 50 volts. These tests were performed at 10 volts and 100 volts at 12% RH. These conditions are more stringent than ANSI Z41.

As can be appreciated from the foregoing description, the various embodiments of the present invention represent a vast improvement over prior footwear designs that are constructed to dissipate static electricity. In particular, the flexible circuit board embodiments of the present invention are relatively compact and require minimal space to install. Furthermore, because they are flexible, they are not as susceptible to damage as the conventional resistors used in other shoe designs. The resistors provide a series of load bearing contact surfaces for more uniform distribution of the weight pressure from the insole to the outsole, and thus result in reduction of the pressure in each resistor. The impendence dimensions of the resistors employed by the present invention are generally smaller and more stable than such prior resistor arrangements and, therefore, they can typically resist more pressure. Furthermore, if one or two of the resistors of the present invention fail, the total impedance value will be below $10^7$ ohms. Furthermore, because the flexible circuit board determines the major part of the impedance of the sole, the impendence of the sole materials employed is less critical. Therefore a wider range of materials can be used to fabricate the sole. Manufacturing costs can thus be greatly reduced without affecting quality requirement because the impedance of the resistor components in the midsole is very stable and will not change in a wet environment such as perspiration from the wearer's foot or a wet floor surface, the total impedance of the sole can still be maintained within a desired range of impedance.

Figure 10:
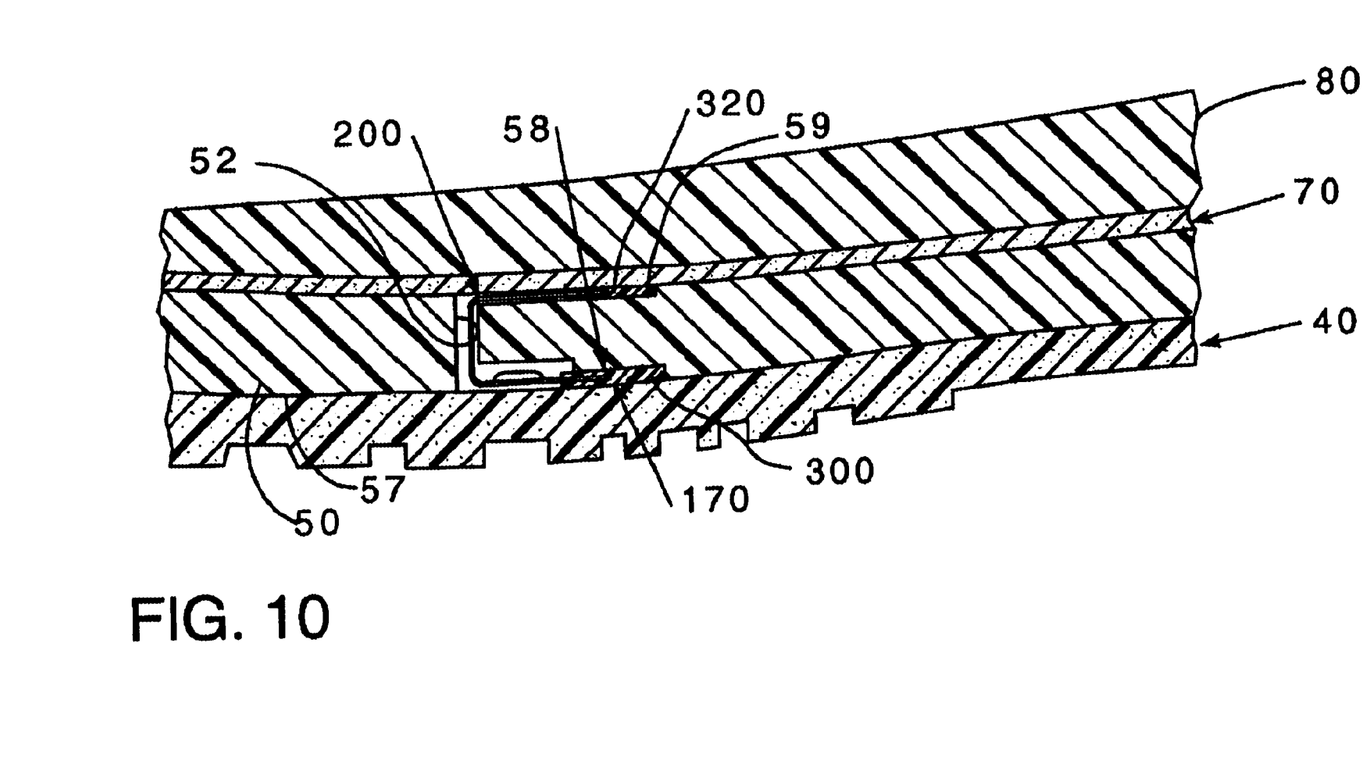
FIG. 10 is an enlarged partial view of another sole embodiment showing an orientation of another printed circuit of the present invention.
Figure 11:
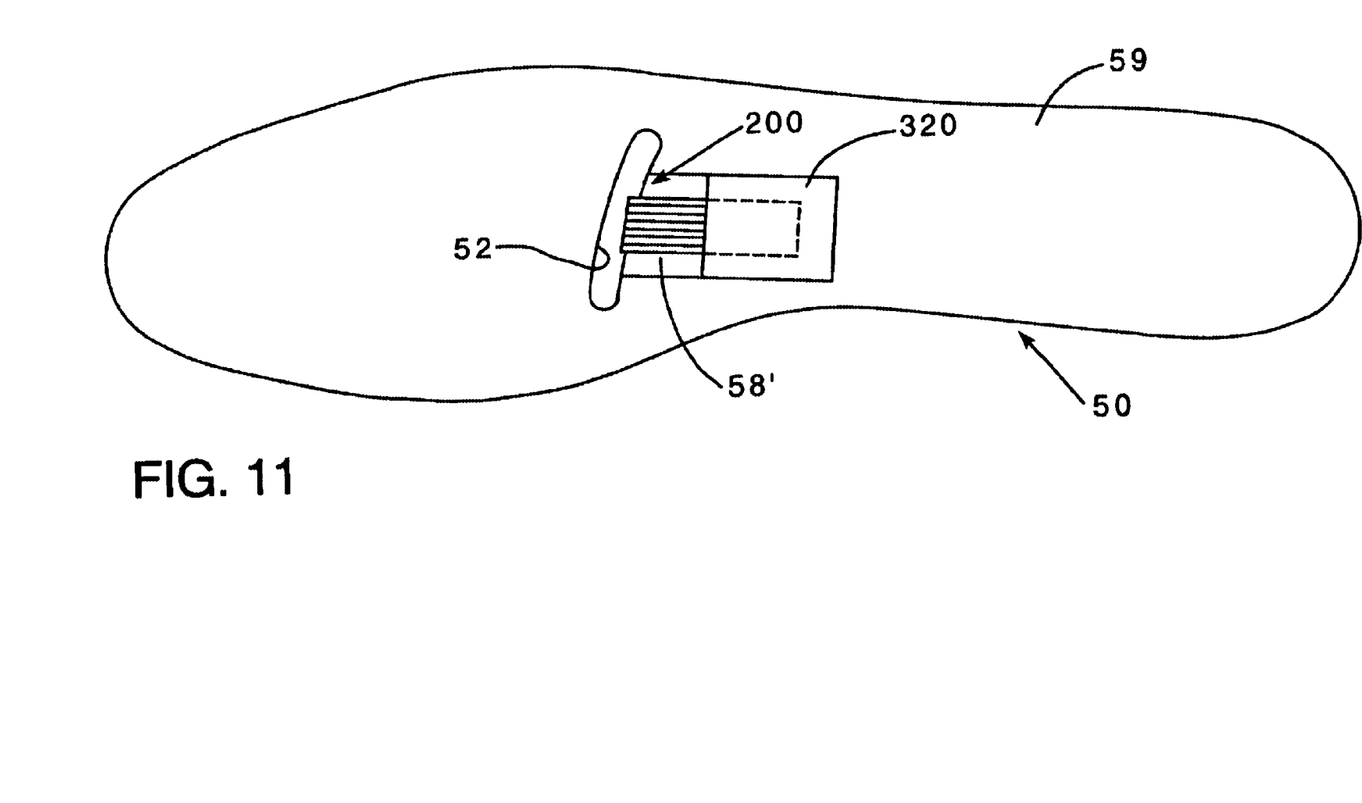
FIG. 11 is top view of a midsole and a portion of the printed circuit depicted in FIG. 10.
Figure 12:
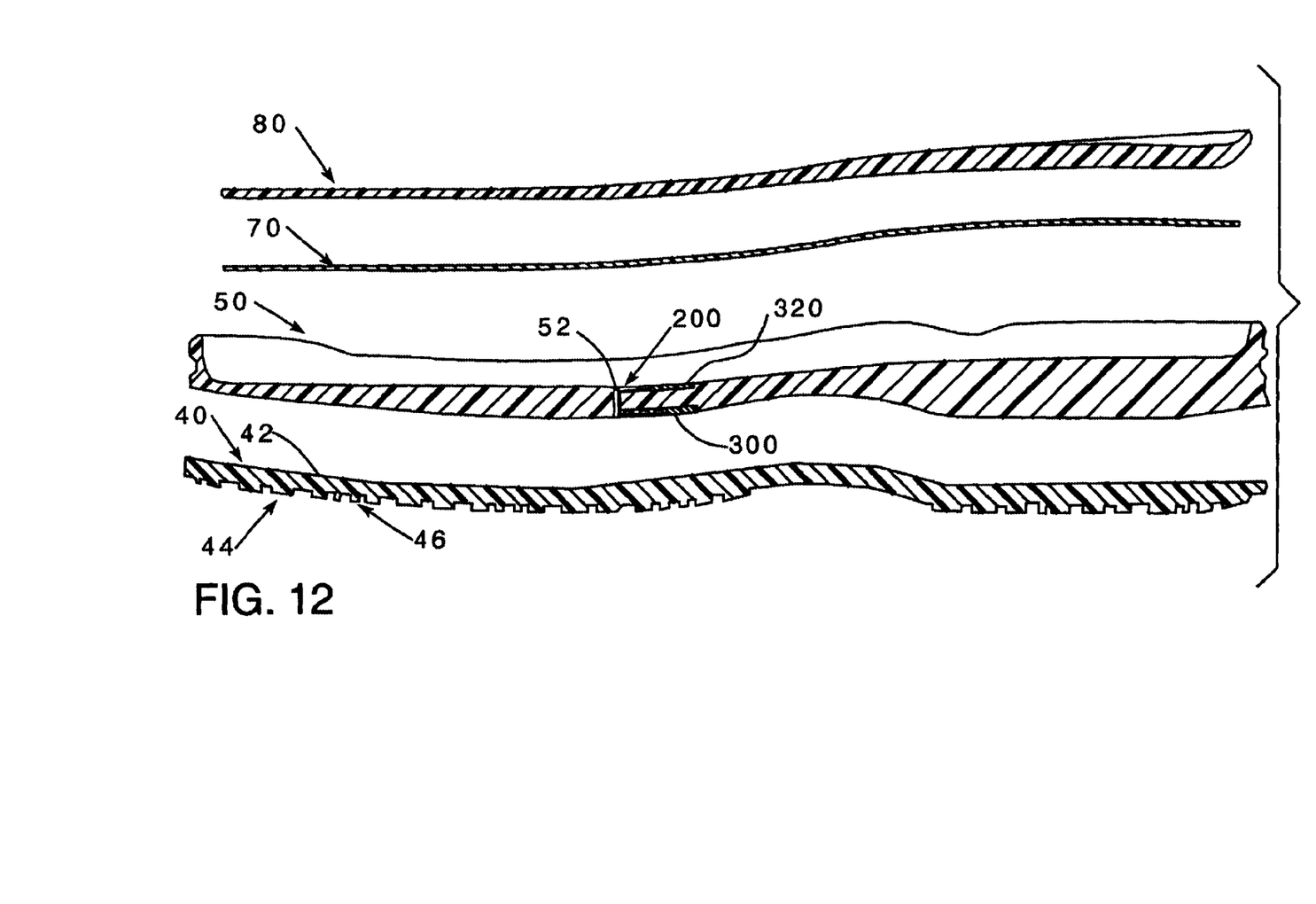
FIG. 12 is a cross-sectional assembly view of the sole of FIG. 10.

Another printed circuit 200 embodiment of the present invention is depicted in FIGS. 10–15. In this embodiment, the printed circuit 200 includes at least one electrically conductive path or conductor path. As can be seen in FIG. 12, this embodiment of the printed circuit 200 includes a first electrically conductive path 210, a second electrically conductive path 220 and a third electrically conductive path 230. The paths 210, 220, 230 may be formed from copper foil or similar material utilizing conventional chemical milling techniques. In this embodiment, the electrical conductive paths 210, 220, 230 may be approximately 25 μm thick. However, copper foil or similar materials having other thicknesses could conceivably be used.

The electrically conductive paths 210, 220, 230 may be attached to a first substrate 240 with a commercially available adhesive 249 such as that adhesive supplied by King Her Chemical Industrial Corporation of No. 38, 18$^{th}$ RD., Industrial Park, Taichung, Taiwan, R.O.C. However, other similar adhesives may be employed. See FIG. 13. In this embodiment, the first substrate 240 may comprise a polyimide sheet material and having a thickness of 18 μm. However, other flexible sheet materials may also be used. The first substrate 240 has a first end 242 and a second end 244 and a first side 246 and a second side 248. The first electrically conductive path 210, the second electrically conductive path 220 and the third electrically conductive path 230 are attached to the first side 246 of the first substrate 240 such that a first end 212 of the first path 210 is adjacent the first end 242 of the first substrate and the second end 214 of the first path 210 is adjacent the second end 244 of the first substrate 240, the first end 222 of the second path is adjacent the first end 242 of the first substrate 240, the second end 224 of the second path 220 is adjacent the second end 244 of the first substrate 240, the first end 232 of the third path 230 is adjacent to the first end 242 of the first substrate 240 and the second end 234 of the third path 230 is adjacent to the second end 244 of the first substrate 240. See FIGS. 12 and 13. The paths 210, 220, 230 may be attached to the first side of 246 of the first substrate 240 by a layer of commercially available adhesive 249, such as that adhesive such as that adhesive supplied by King Her Chemical Industrial Corporation of No. 38, 18$^{th}$ RD., Industrial Park, Taichung, Taiwan, R.O.C. However, other similar adhesives may be employed.

Figure 13:
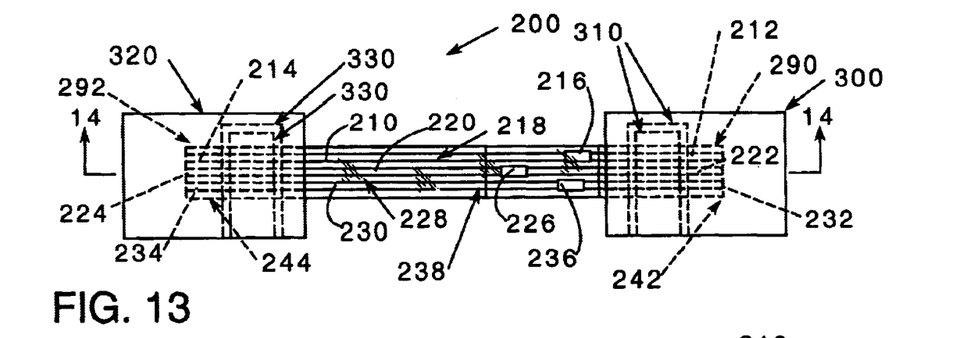
FIG. 13 is a top view of the printed circuit depicted in FIGS. 10–12.
Figure 14:
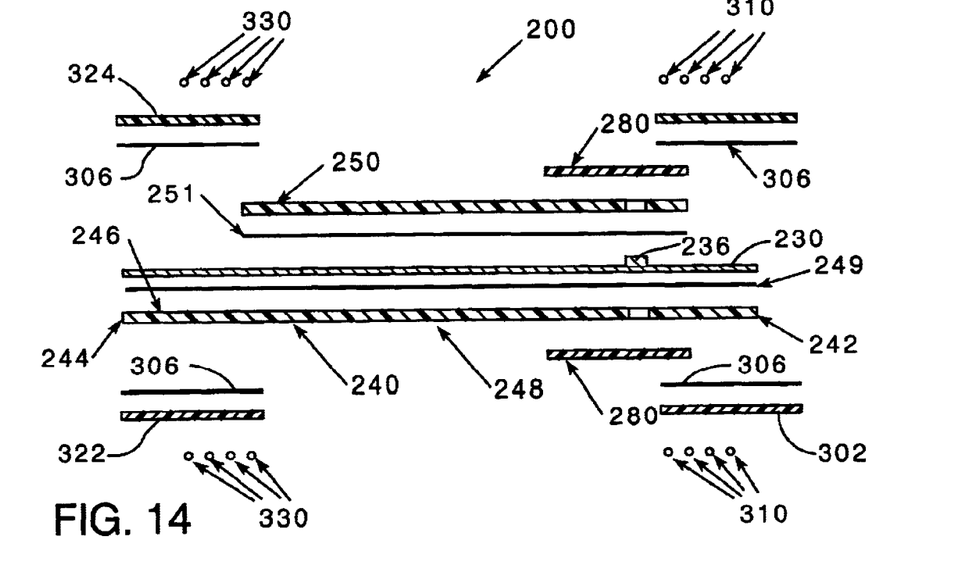
FIG. 14 is a cross-sectional exploded assembly view of the printed circuit of FIG. 13 taken along line 14—14 in FIG. 13.
Figure 15:
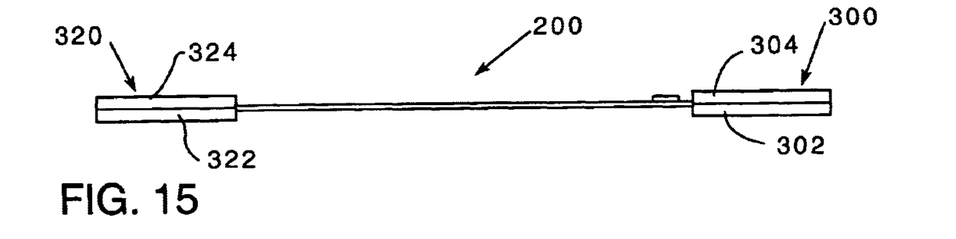
FIG. 15 is a side elevational view of the printed circuit of FIGS. 10–14.

Also in this embodiment, a first resistor 216 is electrically coupled to the first path 210. A second resistor 226 is electrically coupled to the second path 220. A third resistor 236 is electrically coupled to the third path 230. The resistors 216, 226, 236 may comprise commercially available 6.8M-ohm resistors that are electrically coupled (soldered, etc.) to their respective path. In this embodiment, a second substrate 250, in the form of polyimide sheet may be attached to the first side 246 of the first substrate and the central portions 218, 228, 238 of the first, second and third paths 210, 220, 230, respectively by a second layer of commercially available adhesive 251 of the type described above. In particular, the central portion 218 of the first path 210, the central portion 228 of the second path 220 and the central portion 238 of the third path 230 are encapsulated between the first substrate 240 and the second substrate 250. As can be seen in FIG. 13, the second substrate 250 only covers the central portions of the paths such that the first ends 212, 222, 232, of the first, second and third paths 210, 220, 230, respectively are exposed.

In this embodiment, the printed circuit 200 is assembled under pressure and may have an overall thickness of approximately 80–90 μm. An overall thickness of less than 3 mm should also work well. However, the printed circuit 200 may have a variety of other thicknesses that afford the circuit 200 the flexibility to be positioned within the sole assembly 30 as will be further discussed below. Thus, as used herein, the term "flexible" means that at least one portion of the circuit 200 may be bent or positioned relative to another position of the printed circuit such that those portions are not coplanar with respect to each other without damaging the printed circuit or its components (i.e., without hampering or destroying the ability of the first, second and third paths 210, 220, 230, respectively to conduct electrical current). The skilled artisan will appreciate that such construction enables the flexible printed circuit to be installed in a variety of advantageous configurations. It is conceivable, however, that the conductive paths 210, 220, 230, etc. may be affixed to a relatively rigid substrate that that has been preformed to a desired shape for installation in the manner described herein. Therefore, while the flexible substrates and circuits described herein are capable of flexing with the sole, it is conceivable that rigid substrates could also be employed. Thus, the protection afforded to the printed circuit herein should not be limited to circuits formed on flexible substrates, but should also encompass rigid printed circuits.

Also in this embodiment, a first attachment pad assembly 300 is attached to a first end 290 of the printed circuit 200 and a second pad assembly 320 is attached to a second end 292 of the printed circuit 200. Such attachment pad assemblies provide an increased area for accommodating adhesive for attaching the ends of the printed circuit to portions of the sole assembly. More specifically and with reference to FIGS. 12–14, the first pad assembly 300 of this embodiment may comprise, for example, a first pad member 302 and a primary pad member 304. In this embodiment, the first and primary pad members 302, 304 are fabricated from a commercially available conductive EVA material. However, other conductive materials may be employed. In this embodiment, the first and primary pad members 302, 304 afford a relatively large area for attachment to the other sole components as will be discussed in further detail below. For example, the first and primary pad members 302, 304 may be approximately 1.5 inches (38 mm)×approximately 1.25 inches (31.75 mm) and 0.0625 inches (1.6 mm) thick. However, it is conceivable that the first and primary pad members 302, 304 may be made in other suitable sizes and that the sizes of the first and primary pad members 302, 304 may be dissimilar.

The first ends 212, 222, 232 of the conductive pathways 210, 220, 230, respectively may be affixed to the first pad member 302 by a conductive adhesive 306 of the type described above. Similarly, a portion of the first substrate 240 may be attached to the primary pad member by another layer of the conductive adhesive 306. The conductive adhesive 306 may also serve to join the first pad member 302 to the primary pad member 304. In addition, the first ends 212, 222, 232 of the conductive pathways 210, 220, 230, respectively may be joined to the first and primary pad members 302, 304 by stitches 310 which extend through the first end of the printed circuit 200 and the first and primary pad members 302, 304. The stitches 310 may be formed from a conductive or non-conductive thread or similar material.

Likewise, the second pad assembly 320 of this embodiment may comprise, for example, a second pad member 322 and a secondary pad member 324. In this embodiment, the second and secondary pad members 322, 324 may also be fabricated from conductive EVA material. The second and secondary pad assemblies afford a relatively large area for attachment to the other sole components as will be discussed in further detail below. For example, the second and secondary pad members may be approximately 1.5 inches (38 mm)×approximately 1.25 inches (31.75 mm) and 0.0625 (1.6 mm) thick. However, it is conceivable that the second and secondary pad members 322, 324 may be made in other suitable sizes and that the sizes of the second and secondary pad members 322, 324 may be dissimilar.

The second ends 212, 222, 232 of the conductive pathways 210, 220, 230, respectively may be affixed to the second pad member 322 by a conductive adhesive 306 of the type described above. Similarly, the end 244 of the first substrate 240 may be attached to the secondary pad member 324 by another layer of the conductive adhesive 306. The conductive adhesive 306 may also serve to join the second pad member 322 to the secondary pad member 324. In addition, the first ends 212, 222, 232 of the conductive pathways 210, 220, 230, respectively may be joined to the second and secondary pad members 322, 324 by stitches 330 which extend through the second end 292 of the printed circuit 200 and the second and secondary pad members 322, 324. The stitches 330 may be formed from conductive or non-conductive thread or similar material.

As was described above, the flexible printed circuit 200 is provided with three paths or conductors 210, 220, 230 that have a corresponding resistor 216, 226, 236 attached thereto. The total amount of resistance through the flexible printed circuit 200 is determined by the quantity and size of resistors employed. For example, the total impedance for the three 6.8M ohm resistors may be calculated as set forth above and may equal 2.267 M ohms=$2.267\times10^6$ ohms. If one of the three resistors fails, the total impedance value for the flexible circuit board of this embodiment will be 3.4 M ohms=$3.4\times10^6$ ohms. As indicated above, at least one major company in the computer industry recommends that the impedance of a conductive shoe be maintained within $10^6$ ohms to $10^7$ ohms. Thus, in this embodiment, even if two resistors fail, the total impedance value will be at $6.8\times10^6$ ohms, which is still below the upper limit of $10^7$ ohms.

Those of ordinary skill in the art will appreciate that the impedance of the flexible circuit board 200 may be varied by altering the number of paths (conductors) and resistors to achieve a desired amount of impedance in accordance with standard electrical engineering formulas (i.e., "Ohm's Law") that were set forth above. In this embodiment, a moisture resistant barrier 280 may be wrapped over the resistors 216, 226, 236 to retard and prevent the infiltration of moisture into the points where the resistors 216, 226, 236 are coupled to the paths 210, 220, 230, respectively. The moisture barrier 280 may comprise a wrapping of conventional electrical insulation tape. However, the moisture resistant barrier 280 may be formed with other materials such as sealant, glue or the like.

The flexible printed circuit 200 may be installed in the footwear as shown in FIGS. 10 and 11. As can be seen in those Figures, the midsole 50 has a hole or passageway 52 therethrough sized to receive a portion of the flexible circuit 200. In addition, an undercut 58 area may be provided in the bottom surface 57 of the midsole 50 to accommodate the resistors 216, 226, 236 and the first pad assembly 320 when the circuit 200 is supported in the midsole 50 as shown. Likewise, an upper notch 58' may be provided in the upper surface 59 of the midsole 50 to accommodate the second pad assembly 320. See FIG. 12. As can be seen, such arrangement permits the circuit 200 to be oriented such that the first pad assembly 302 is in electrical contact with the conductive outsole 40 to transmit electrical current thereto. Similarly, the second pad assembly 320 is supported in electrical contact with the conductive insole board 70 to receive electrical current therefrom. If desired, the first pad assembly may be attached to the underside 57 of the midsole with a conductive adhesive such as a commercially available ESD conductor glue 170 that has a resistance range of $5\times10^4$~$10^6$ Ohms or other similar glues or adhesive mediums. Similarly, the second pad assembly 320 may be affixed to the upper surface 59 of the midsole by another such conductive adhesive. The midsole 50 is attached to the outsole 40 by commercially available conductive cement. Similarly, the insole board 70 is attached to the midsole 50 by commercially available conductive cement. In this embodiment, the sock liner 80 is not attached to the insole board. Thus, when installed as shown in FIGS. 10 and 11, the second conductive pad assembly 320 is affixed to the conductive insole board 70 and the flexible circuit 200 extends through the opening 52 in the midsole 50 and the first conductive pad assembly 300 is attached to the conductive outsole 40. Therefore, such arrangement permits a static charge to pass from the foot through the conductive sock liner 80, through the conductive insole board 70, through the second conductive pad assembly 320, through paths 210, 220, 230 and resistors 216, 226, 236 to provide an impedance of $2.267 \times 10^6$ ohms. This charge then passes from the paths 210, 220, 230 through the first conductive pad assembly 300 to the conductive outsole 40 such that the charge is safely dissipated to the floor surface. In this embodiment, by way of example only, the impedance of the respective parts of the sole assembly is: sock liner 80: $2.5 \times 10^4 - 2 \times 10^5$ ohms; insole board 70: $10^4 - 10^5$ ohms; resistors 116, 126, 136: $6.8 \times 10^6$ ohms (each); midsole 50: $10^{11} - 10^{12}$ ohms; conductive outsole 40: $10^4 - 3 \times 10^4$ ohms; and conductive adhesive: $10^4 - 10^5$ ohms. This embodiment would also have results similar to those test results set forth above.

As can be appreciated from the foregoing description, the various embodiments of the present invention represent a vast improvement over prior footwear designs that are constructed to dissipate static electricity. In particular, the flexible circuit board embodiments of the present invention are relatively compact and require minimal space to install. Furthermore, because they are flexible, they are not as susceptible to damage as the conventional resistors used in other shoe designs. The resistors provide a series of load bearing contact surfaces for more uniform distribution of the weight pressure from the insole to the outsole, and thus result in reduction of the pressure in each resistor. The impendence dimensions of the resistors employed by the present invention are generally smaller and more stable than such prior resistor arrangements and, therefore, they can typically resist more pressure. Furthermore, if one or two of the resistors of the present invention fail, the total impedance value will be below $10^7$ ohms. Furthermore, because the flexible circuit board determines the major part of the impedance of the sole, the impendence of the sole materials employed is less critical. Therefore a wider range of materials can be used to fabricate the sole. Manufacturing costs can thus be greatly reduced without affecting quality requirement because the impedance of the resistor components in the midsole is very stable and will not change in a wet environment such as perspiration from the wearer's foot or a wet floor surface, the total impedance of the sole can still be maintained within a desired range of impedance.

Whereas particular embodiments of the invention have been described herein for the purpose of illustrating the invention and not for the purpose of limiting the same, it will be appreciated by those of ordinary skill in the art that numerous variations of the details, materials and arrangement of parts may be made within the principle and scope of the invention without departing from the invention as described in the appended claims.

What is claimed is:

1. An electrostatic circuit for a sole having an outsole, an insole and a midsole positioned between the insole and outsole, said electrostatic circuit comprising:

a first substrate having first and second surfaces and a first end and a second end;

at least one conductor path printed on said first surface of said first substrate such that an entire length of each said conductor path is completely supported on said first surface of said first substrate, each said conductor path having a first exposed end adjacent said first end of said first substrate and being attachable to the outsole and a second exposed end adjacent said second end of said first substrate and attachable to the insole; and at least one resistor electrically coupled to each said conductor path and mounted to said first substrate.

2. The electrostatic circuit of claim 1 wherein said first substrate is flexible and extends through an opening in the midsole.

3. The electrostatic circuit of claim 1 further comprising a second substrate attached to said first substrate such that a central portion of each said conductor path is encapsulated between said first and second substrates, said second substrate not covering said first and second ends of each said conductor path.

4. The electrostatic circuit of claim 3 further comprising a moisture barrier wrapped around a portion of said first and second substrates and covering said resistors.

5. The electrostatic circuit of claim 1 wherein said first and second exposed ends of each said conductor path are adjacent a first side of said first substrate and wherein said electrostatic circuit further comprises a first adhesive attached to a second side of said first substrate adjacent said first and second ends thereof.

6. The electrostatic circuit of claim 5 further comprising a second adhesive for affixing said first end of each said conductor path to the outsole and said second end of each said conductor path to the insole.

7. The electrostatic circuit of claim 1 wherein the total impedance provided by said resistors is less than or equal to $10^7$ ohms.

8. The electrostatic circuit of claim 1 wherein said first substrate is flexible.

9. The electrostatic circuit of claim 8 wherein said first substrate is fabricated from a polyimide sheet material having a thickness of approximately 25 μm.

10. The electrostatic circuit of claim 1 further comprising:

a first attachment pad assembly attached to said first end of said substrate; and a second attachment pad assembly attached to said second end of said substrate.

11. An electrostatic circuit for a sole having an outsole, an insole and a midsole positioned between the insole and outsole, said electrostatic circuit comprising:

a first substrate having a first end and a second end;

at least one conductor path attached to said first substrate, each said conductor path having a first exposed end adjacent said first end of said first substrate and being attachable to the outsole and a second exposed end adjacent said second end of said first substrate and attachable to the insole;

at least one resistor electrically coupled to each said conductor path and mounted to said first substrate;

a first conductive attachment pad assembly attached to said first end of said substrate; and a second conductive attachment pad assembly attached to said second end of said substrate.

12. The electrostatic circuit of claim 11 wherein said first attachment pad assembly comprises:

a first conductive pad member attached to said first end of said first substrate;

a primary conductive pad member attached to said first conductive pad member such that a portion of said at least one conductor path is located between said first conductive pad member and said primary conductive pad member and in contact therewith and wherein said second attachment pad assembly comprises:
  a second conductive pad member attached to said second end of said first substrate; and
  a secondary conductive pad member attached to said second conductive pad member such that another portion of said at least one conductor path is located between said second conductive pad member and said secondary conductive pad member and in contact therewith.

13. The electrostatic circuit of claim 12 wherein said first conductive pad member and said primary conductive pad member are attached to each other by conductive adhesive and wherein said second conductive pad member and said secondary conductive pad member are connected each other by conductive adhesive.

14. The electrostatic circuit of claim 12 wherein said first conductive pad member, said primary conductive pad member, said second conductive pad member and said secondary conductive pad member are each fabricated from conductive EVA.

15. The electrostatic circuit of claim 12 wherein said portion of said at least one conductor path is stitched to said first and primary conductive pad members and wherein said another portion of said at least one conductor path is stitched to said second and secondary conductive pad members.

16. An electrostatic circuit for a sole having a conductive outsole, a conductive insole and a nonconductive midsole between the insole and outsole, said electrostatic circuit comprising:
  a first substrate having first and second surfaces and a first end and a second end;
  a first conductor path printed on said first surface of said first substrate such that an entire length of each said first conductor path is completely supported on said first surface of said first substrate, said first conductor path having a first exposed end adjacent said first end of said first substrate and being attachable to the conductive outsole and a second exposed end adjacent said second end of said first substrate and attachable to the conductive insole;
  a first resistor supported on said first surface of said first substrate and electrically coupled to said first conductor path;
  a second conductor path printed on said first surface of said first substrate such that an entire length of each said second conductor path is completely supported on said first surface of said first substrate, said second conductor path having a first exposed end adjacent said first end of said first substrate and being attachable to the conductive outsole and a second exposed end adjacent said second end of said first substrate and attachable to the conductive insole;
  a second resistor supported on said first surface of said first substrate and electrically coupled to said second conductor path;
  a third conductor path printed on said first surface of said first substrate, said third conductor path having a first exposed end adjacent said first end of said first substrate and being attachable to the conductive outsole and a second exposed end adjacent said second end of said substrate and attachable to the conductive insole; and
  a third resistor supported on said first surface of said first substrate and electrically coupled to said third conductor path.

17. The electrostatic circuit of claim 16 wherein said first substrate is flexible and extends through an opening in the nonconductive midsole.

18. The electrostatic circuit of claim 16 further comprising a second substrate attached to said first substrate such that a central portion of each said first, second and third conductor paths is encapsulated between said first and second substrates, said second substrate not covering said first and second ends of each said first, second and third conductor paths.

19. The electrostatic circuit of claim 18 further comprising a moisture barrier wrapped around a portion of said first and second substrates and covering said first, second and third resistors.

20. The electrostatic circuit of claim 16 wherein said first and second exposed ends of each said first, second and third conductor paths are adjacent a first side of said first substrate and wherein said electrostatic circuit further comprises a first adhesive attached to a second side of said first substrate adjacent said first and second ends thereof.

21. The electrostatic circuit of claim 20 further comprising a second adhesive for affixing each said first end of said first second and third conductor paths to the conductive outsole and each said second end of said first, second and third conductor paths to the conductive insole.

22. The electrostatic circuit of claim 16 further comprising:
  a first attachment pad assembly attached to said first end of said substrate; and
  a second attachment pad assembly attached to said second end of said substrate.

23. The electrostatic circuit of claim 22 wherein said first attachment pad assembly comprises:
  a first conductive pad member attached to said first end of said first substrate;
  a primary conductive pad member attached to said first conductive pad member such that a portion of said first conductor path, a portion of said second conductor path and a portion of said third conductor path are located between said first conductive pad member and said primary conductive pad member and in contact therewith and wherein said second attachment pad assembly comprises:
  a second conductive pad member attached to said second end of said first substrate; and
  a secondary conductive pad member attached to said second conductive pad member such that another portion of said first conductor path, another portion of said second conductor path and a portion of said third conductor path are located between said second conductive pad member and said secondary conductive pad member and in contact therewith.

24. The electrostatic circuit of claim 23 wherein said first conductive pad member and said primary conductive pad member are attached to each other by conductive adhesive and wherein said second conductive pad member and said secondary conductive pad member are connected each other by conductive adhesive.

25. The electrostatic circuit of claim 23 wherein said first conductive pad member, said primary conductive pad member, said second conductive pad member and said secondary conductive pad member are each fabricated from conductive EVA.

26. The electrostatic circuit of claim 23 wherein said portion of said first conductor path, said portion of said second conductor path and said portion of said third conductor path are stitched to said first and primary pad members and wherein said another portion of said first conductor path, said another portion of said second conductor path and said another portion of said third conductor path are stitched to said second and secondary conductive pad members.

27. A sole for a conductive shoe, said sole comprising:
an outsole;
a midsole adjacent said outsole;
an insole adjacent said midsole; and
a printed circuit comprising:
a first substrate having a first surface;
at least one conductor path printed on said first surface of said first substrate such that an entire length of each said conductor path is completely supported on said first surface of said first substrate, each said conductor path having a first end attached to said outsole and a second end attached to said insole; and
at least one resistor electrically coupled to each said conductor path and mounted to said first substrate.

28. The sole of claim 27 wherein said first substrate is flexible and extends through an opening through a portion of said midsole.

29. The sole of claim 28, further comprising an undercut area in said midsole adjacent said opening, said undercut area sized to accommodate at least a portion of at least one of said resistors therein.

30. The sole of claim 27 further comprising a sock liner adjacent said insole.

31. The sole of claim 30 wherein said sock liner is fabricated from polyurethane and carbon powder.

32. The sole of claim 31 wherein said flexible substrate comprises a polyimide sheet material.

33. The sole of claim 27 wherein said outsole is fabricated from material selected from the group consisting of polyurethane and rubber.

34. The sole of claim 27 wherein said outsole has an electrical resistance value of less than $1 \times 10^6$ ohms.

35. The sole of claim 27 wherein said midsole is fabricated from material selected from the group of polyurethane and EVA.

36. The sole of claim 27 wherein said midsole has an electrical resistance value of greater than $1 \times 10^7$ ohms.

37. The sole of claim 27 wherein one side of said outsole has a tread pattern thereon.

38. The sole of claim 27 wherein said insole is fabricated from polyurethane and carbon powder.

39. The sole of claim 27 wherein said insole has an electrical resistance value of less than $1 \times 10^6$ ohms.

40. The sole of claim 27 wherein said sock liner has a resistance value of less than $1 \times 10^6$ ohms.

41. The sole of claim 27 further comprising:
a first attachment pad assembly attached to said first end of each said conductor path and in contact with said outsole; and
a second attachment pad assembly attached to said second end of each said conductor path and in contact with said insole.

42. The electrostatic circuit of claim 41 wherein said first attachment pad assembly comprises:
a first conductive pad member attached to a first end of said first substrate;
a primary conductive pad member attached to said first conductive pad member such that a portion of each said conductor path is located between said first conductive pad member and said primary conductive pad member and in contact therewith and wherein said second attachment pad assembly comprises:
a second conductive pad member attached to a second end of said first substrate; and
a secondary conductive pad member attached to said second conductive pad member such that another portion of each said conductor path is located between said second conductive pad member and said secondary conductive pad member and in contact therewith.

43. The electrostatic circuit of claim 42 wherein said first conductive pad member and said primary conductive pad member are attached to each other by conductive adhesive and wherein said second conductive pad member and said secondary conductive pad member are connected to each other by conductive adhesive.

44. The electrostatic circuit of claim 42 wherein said first conductive pad member, said primary conductive pad member, said second conductive pad member and said secondary conductive pad member are each fabricated from conductive EVA.

45. The electrostatic circuit of claim 42 wherein said each portion of said conductor are stitched to said first and primary pad members and wherein each said another portion of said conductor path are stitched to said second and secondary conductive pad members.

46. A sole for a conductive shoe, said sole comprising:
an outsole having an electrical resistance value of less than $1 \times 10^6$ ohms;
a midsole adjacent said outsole and having an electrical resistance value of greater than $1 \times 10^7$ ohms;
an insole adjacent said midsole and having an electrical resistance value of less than $1 \times 10^6$ ohms; and
a printed circuit comprising:
a first substrate having a first surface and first and second ends;
at least one conductor path printed on said first surface of said first substrate such that an entire length of each said conductor path is completely supported on said first surface of said first substrate, each said conductor path having a first end attached to said outsole and a second end attached to said insole; and
at least one resistor electrically coupled to each said conductor path and mounted to the first substrate.

47. The sole of claim 46 further comprising a sock liner adjacent said insole and having an electrical resistance value of less than $1 \times 10^6$ ohms.

48. The sole of claim 46 further comprising:
a first conductive attachment pad assembly attached to one end of each said conductor path and said outsole; and
a second conductive attachment pad assembly attached to another end of each said conductor path and said insole.

49. A sole for an item of footwear, said sole comprising:
an outsole having a predetermined electrical impedance;
a midsole adjacent to said outsole and having a predetermined electrical impedance that is greater than said predetermined electrical impedance of said outsole;
an insole adjacent said midsole and having a predetermined electrical impedance that is less than said predetermined electrical impedance of said midsole;
a first substrate having first and second surfaces and first and second ends, said first substrate extending between said outsole and said insole;

a conductor printed on said first surface of said first substrate and having one end attached to said outsole and another end attached to said insole; and a resistor attached to said conductor.

50. The sole of claim 49 further comprising a sock liner adjacent said insole and having a predetermined electrical impedance that is less than said predetermined electrical impedance of said midsole.

51. A method for applying a desired amount of electrical impendence to an electrostatic current passing through a shoe having an outsole, an insole and a midsole between the outsole and insole, said method comprising:

printing a first conductive path entirely on a first surface of a substrate;

affixing one end of a the first conductive path to the outsole;

electrically coupling a first resistor having the desired amount of impedance to the conductive path; and affixing another end of the first conductive path to the insole.

52. The method of claim 51 wherein said affixing one end of the first conductive path comprises attaching the one end of the first conductive path to the outsole with a conductive adhesive and wherein said affixing another end of the first conductive path to the insole comprises attaching the another end of the first conductive path to the insole with conductive adhesive.

53. The method of claim 51 further comprising extending a portion of the substrate through a portion of the midsole.

54. The method of claim 51, further comprising:

affixing one end of a second conductive path formed on the substrate to the outsole;

electrically coupling a second resistor to the second conductive path, the first and second resistors providing the desired amount of impedance; and affixing another end of the second conductive path to the insole.

55. The method of claim 54, further comprising:

affixing one end of a third conductive path formed on the substrate to the outsole;

electrically coupling a third resistor to the third conductive path, the first, second and third resistors providing the desired amount of impedance; and affixing another end of the third conductive path to the insole.

56. The method of claim 54 wherein said affixing one end of the second conductive path comprises attaching the one end of the second conductive path to the outsole with a conductive adhesive and wherein said affixing another end of the second conductive path to the insole comprises attaching t he another end of the second conductive path to the insole with conductive adhesive.

57. The method of claim 55 wherein said affixing one end of the third conductive path comprises attaching the one end of the third conductive path to the outsole with a conductive adhesive and wherein said affixing another end of the third conductive path to the insole comprises attaching the another end of the third conductive path to the insole with conductive adhesive.

58. A method for applying a desired amount of electrical impendence to an electrostatic current passing through a shoe having an outsole, an insole and a midsole between the outsole and insole, said method comprising:

affixing one end of a first conductive path to a first conductive pad;

affixing the first conductive pad to the outsole;

electrically coupling a first resistor having the desired amount of impedance to the conductive path;

affixing another end of the first conductive path to a second conductive pad; and affixing the second conductive pad to the insole.

59. A method of manufacturing a sole for a conductive shoe, comprising:

affixing a first conductive path to a first surface of a substrate such that the first conductive path is completely received on the first surface and has a first exposed end and a second exposed end;

attaching a first resistor to the first conductive path;

forming a conductive outsole;

forming a non-electrically conductive midsole;

supporting the nonelectrically conductive midsole on the electrically conductive outsole;

forming an electrically conductive insole;

attaching the electrically conductive insole to the non-electrically conductive midsole; and supporting the substrate within the midsole such that the first exposed end of the first conductive path is in electrical contact with the electrically conductive outsole and the second end of the first electrically conductive path is in electrical contact with the electrically conductive insole.

60. The method of claim 59 further comprising:

affixing the first exposed end of the first electrically conductive path to the electrically conductive outsole; and affixing the second exposed end of the first electrically conductive path to the electrically conductive insole.

61. The method of claim 59 further comprising:

affixing a second conductive path to the substrate such that the second conductive path has a first exposed end and a second exposed end; and attaching a second resistor to the second conductive path, said substrate supported within said midsole such that the first ends of the first and second electrically conductive paths are in contact with the electrically conductive outsole and the second ends of the first and second electrically conductive paths are in contact with the electrically conductive insole.

62. The method of claim 61 further comprising:

affixing the first exposed ends of the first and second electrically conductive paths to the electrically conductive outsole; and affixing the second exposed ends of the first and second electrically conductive paths to the electrically conductive insole.

63. The method of claim 61 further comprising:

affixing a third conductive path to the substrate such that the third conductive path has a first exposed end and a second exposed end; and attaching a third resistor to the third conductive path, the substrate supported within said midsole such that the first ends of the first, second and third electrically conductive paths are in contact with the electrically conductive outsole and the second ends of the first, second and third electrically conductive paths are in contact with the electrically conductive insole.

64. The method of claim 63 further comprising:

affixing the first exposed ends of the first, second and third electrically conductive paths to the electrically conductive outsole; and affixing the second exposed ends of the first, second and third electrically conductive paths to the electrically conductive insole.

* * * * *